United States Patent [19]

Holt

[11] Patent Number: 4,698,275

[45] Date of Patent: Oct. 6, 1987

[54] WIRE MAT MATEABLE WITH A CIRCUIT BOARD

[75] Inventor: Richard C. Holt, Fairhaven, Mass.

[73] Assignee: Augat Inc., Mansfield, Mass.

[21] Appl. No.: 886,549

[22] Filed: Jul. 16, 1986

Related U.S. Application Data

[63] Continuation of Ser. No. 549,484, Nov. 4, 1983, Pat. No. 4,627,162.

[51] Int. Cl.$^4$ ............................................. D06N 3/18
[52] U.S. Cl. .................................. 428/40; 428/209; 428/247; 428/344; 428/901
[58] Field of Search ................. 174/68.5; 428/40, 109, 428/209, 246, 247, 344, 901

[56] References Cited

U.S. PATENT DOCUMENTS

| | | |
|---|---|---|
| 2,958,926 | 11/1960 | Morison . |
| 3,191,100 | 6/1965 | Sorvillo . |
| 3,234,629 | 2/1966 | Wheeler . |
| 3,239,396 | 3/1966 | Bohannon, Jr. . |
| 3,247,314 | 4/1966 | Mittendorf . |
| 3,279,040 | 10/1966 | Propster, Jr. . |
| 3,295,189 | 1/1967 | Hammell . |
| 3,311,696 | 3/1967 | Melnick . |
| 3,353,263 | 11/1967 | Helms . |
| 3,505,144 | 4/1970 | Kilduff et al. . |
| 3,567,999 | 3/1971 | Larson et al. . |
| 3,644,792 | 2/1972 | Fields . |
| 3,646,572 | 2/1972 | Burr . |
| 3,674,914 | 4/1972 | Burr . |
| 3,701,838 | 10/1972 | Olney, Jr. . |
| 3,778,899 | 12/1973 | Johnson . |
| 3,786,172 | 1/1974 | Conley . |
| 3,842,190 | 10/1974 | Towell . |
| 3,981,076 | 9/1976 | Nicolas . |
| 4,097,684 | 6/1978 | Burr . |
| 4,152,477 | 5/1979 | Haruta et al. . |
| 4,251,712 | 2/1981 | Parr . |
| 4,387,509 | 6/1983 | Dechelette . |
| 4,414,741 | 11/1983 | Holt . |

FOREIGN PATENT DOCUMENTS 2327386 12/1973 Fed. Rep. of Germany .

OTHER PUBLICATIONS

What is Solder Wrap?, 1975, Publication by United Wiring and Manufacturing Co.
Electronics, Apr. 28, 1977, reprint titled Wiring System is Multifaceted.
EDN, Sep. 5, 1979, pp. 227–228.
IPC-DW-425, Standard Specification Proposal by IPC circulated to members Apr. 1981.

Primary Examiner—Howard N. Goldberg
Assistant Examiner—Carl J. Arbes
Attorney, Agent, or Firm—Weingarten, Schurgin, Gagnebin & Hayes

[57] ABSTRACT

A method for producing a wired circuit board is disclosed in which a wire mat is first formed on a fixture and then mated with a circuit board having a specified conductive pad layout on the board surface. A continuous wire is routed on a fixture along a predetermined path over a thermoplastic adhesive layer and the wire is adhered to the layer to fixably position the wire in the routed configuration. The continuous wire is severed at selected locations to form a plurality of wire nets. A wire mat thus formed is mated with a circuit board having conductive pads disposed on the board surface such that selected points of selected wires confront selected conductive pads on the circuit board. Compressive pressure is applied to the wire mat and circuit board to conformally adhere the wire mat to the circuit board. The circuit board and wire mat adhered thereto are next heated at elevated temperature to cure the adhesive layer. Selected points of wires confronting conductive pads on the circuit board are then soldered to the respective pads to complete interconnection of predetermined conductive pads on the circuit board thereby yielding a wired circuit board adapted to receive integrated circuit and other electrical components. A wire mat produced in the disclosed manner may be applied to one or both circuit board surfaces.

3 Claims, 37 Drawing Figures

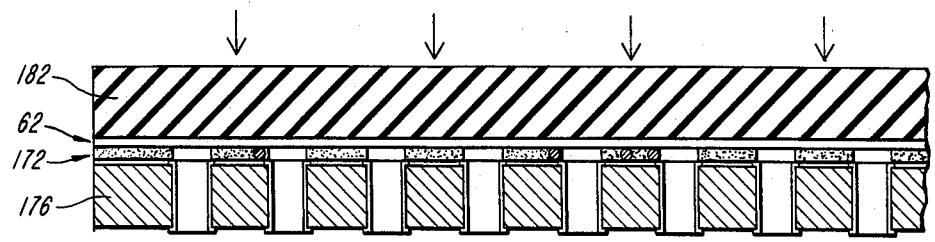
FIG. 28
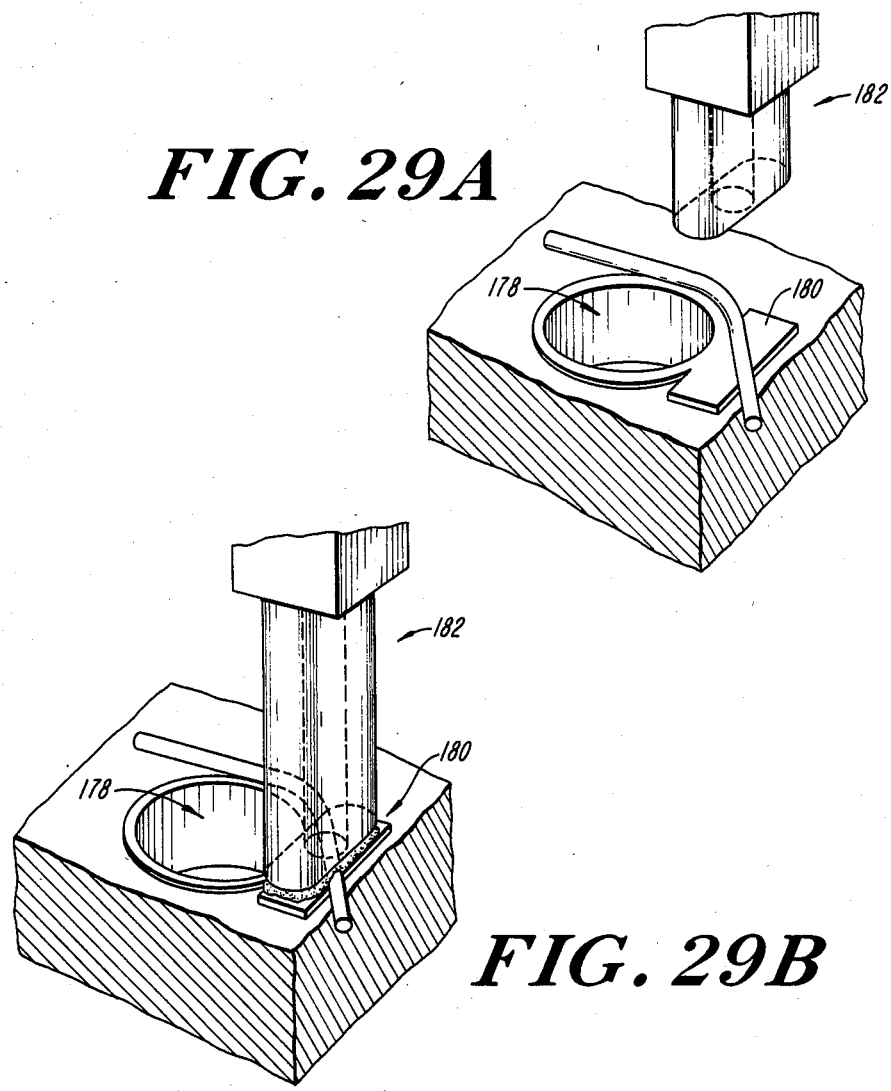
FIG. 29A
FIG. 29B

WIRE MAT MATEABLE WITH A CIRCUIT BOARD

This is a continuation of application Ser. No. 549,484, filed on Nov. 4, 1983, now U.S. Pat. No. 4,627,162 issued Dec. 9, 1986.

FIELD OF THE INVENTION

This invention relates to circuit boards and more particularly circuit boards in which interconnections are produced by mating a wire mat with one or both sides of a circuit board having a defined conductive pad layout.

BACKGROUND OF THE INVENTION

Wired circuit boards employing discrete point to point wiring are often utilized when the volume of circuit boards to be produced does not warrant the production of etched printed circuit boards. Wired circuit boards employing discrete wiring are generally produced by connecting conductive pads on a circuit board with individual wires to form a desired interconnection pattern. Since wired circuit boards are generally produced with automated wire routing machinery, this process is particularly beneficial when it is desired to produce several prototype circuit boards or a limited number of circuit boards for production.

A number of methods are known for producing wired circuit boards. One such method is described in co-pending application Ser. No. 266,620 filed 5/22/81 by the same inventor and assignee as the present invention. Therein disclosed is a method in which interconnecting wires are routed around guide pins upwardly projecting through a circuit board with wires soldered point to point as they are routed from a starting connection point to a final correction point. The routed wires connect selected conductive pads leaving predefined areas free of wiring. These areas are reserved for components such as dual-in-line integrated circuit packages. After completion of wire routing on the circuit board, a thermoplastic sheet is placed over the network of wires to adhere the wires to the circuit board.

Other methods of producing wired circuit boards are disclosed in U.S. Pat. Nos. 3,981,076; 3,842,190; 3,701,838; and 3,694,792.

SUMMARY OF THE INVENTION

In accordance with the present invention, a method is disclosed for producing a circuit board by routing a continuous wire along a predetermined path in a fixture, fixably positioning the continuous wire by adhering the wire to a thermoplastic adhesive layer, severing the wire at selected locations to form a plurality of wire nets defining an intended interconnection pattern, mating the wire nets thus formed with a circuit board having conductive pads disposed in a specified pattern on the board surface, and soldering selected points of selected wire nets to selected conductive pads.

A fixture is provided having a plurality of pins projecting through a wiring fixture plate having apertures sized to slideably receive the pins. The pins are fixably positioned in the fixture plate by pressing a pin retaining plate having apertures sized for interference fit with the pins and coaxially aligned with apertures of the fixture plate over shanks of pins projecting through the fixture plate. A cutter backing plate is overlaid on the pin retaining plate and a thermoplastic adhesive layer is disposed above the cutter backing plate. A continuous wire is then routed along a predetermined path through the pins in accordance with defined routing conventions. Pressure is applied to the continuous wire to fixably position the wire on the underlying thermoplastic adhesive layer.

A second thermoplastic adhesive layer is registered and adhered to a circuit board having a specified conductive pad pattern. The circuit board has a plurality of plated through pin socket receiving apertures intended to receive IC pin sockets or other electrical components. Conductive pads are disposed adjacent the pin socket receiving apertures for electrical interconnection therewith.

After registration and mating of the second thermoplastic adhesive layer to the circuit board, the circuit board is precisely aligned above the wiring fixture and compressive pressure is applied to the circuit board to urge the circuit board and second adhesive layer into adhesive confronting relation with the first adhesive layer, thereby fixably locating the wire nets on the circuit board. Registration and mating of the wire nets to the circuit board in the above described manner assures that selected points of wire nets confront selected conductive pads on the surface of the circuit board.

The circuit board and adhered wire mat are removed from the fixture plate, a low durometer rubber sheet is overlaid on the first adhesive layer, and the circuit board and mat with overlaid rubber sheet are subjected to compressive pressure. This step causes the adhesive layers to conformally coat the wires and the circuit board. The circuit board with wires and adhesive adhered thereto is inserted into an oven and the thermoplastic adhesive material is cured at an elevated temperature. A solder flux is next applied to the circuit board and the board is transferred to an oven for a brief period of time to increase the viscosity of the flux. Wires confronting selected conductive pads on the circuit board are soldered to the pads to complete interconnection of the circuit board. The circuit board is finally cleaned via an ultrasonic cleaning process.

A wire mat produced in accordance with the present disclosure may be provided on one or both surfaces of the circuit board.

BRIEF DESCRIPTION OF THE DRAWINGS

These and other features of the invention are more fully set forth in the solely exemplary detailed description and accompanying drawings of which:

FIG. 28 is a sectional side view illustrating conformal coating of the circuit board and wire nets by application of compressive pressure to the wired surface through a rubber pad;

FIG. 29A is a schematic view of a soldering tip in accordance with the present invention disposed above an intended location of interconnection; and FIG. 29B is a schematic view of the soldering tip of FIG. 29A engaging a selected wire net point and underlying conductive pad.

DETAILED DESCRIPTION OF THE INVENTION

In accordance with the present invention a method is disclosed in which a wire mat having a plurality of wire nets disposed on the mat in a predetermined routing pattern is produced and then mated with a circuit board having a defined conductive etch layout intended for use with the present method. This novel method for producing a wired circuit board comprises three major operations including a wire routing operation, a wire severing operation and a mating operation. The wire mat is produced by laying an adhesive layer over a fixture plate having upwardly projecting pins extending therethrough and then routing a continuous insulated wire along a predetermined path through upwardly projecting pins. The continuous insulated wire is adhered to the underlying adhesive layer by application of compressive pressure. The continuous wire is then severed at selected locations in a cutter operation to produce a plurality of wire nets fixed in position by the adhesive sheet. A second adhesive layer is adhered to a circuit board having a defined conductive pad layout and apertures in a pattern corresponding to the location of guide pins in the fixture. Apertures in the circuit board are plated through and sized to receive integrated circuit or other pin sockets. Conductive pads provided on the circuit board are located adjacent each pin socket aperture and are electrically connected thereto.

The printed circuit board is precisely registered over the wiring fixture plate such that centers of guide pins coaxially align with centers of integrated circuit pin socket receiving apertures. The circuit board and fixture are subjected to compressive pressure thereby forcing the adhesive layer adhered to the circuit board into confronting adhesive contact with the wire net and underlying adhesive layer. As a consequence of wiring in accordance with presently disclosed wiring conventions, selected points of wire nets confront selected conductive pads. The circuit board and wire mat are removed from the fixture and the adhesive layers are cured by subjecting the adhesive layers to an elevated temperature for a defined period of time. Wires confronting conductive pads are then soldered to the pads in a solder reflow operation to interconnect selected ones of the integrated circuit pin socket receiving apertures, thereby completing interconnection of the circuit board.

The circuit board presently disclosed has an identical conductive pad pattern on both sides of the board thereby permitting single sided or double sided wire mat circuit boards to be produced in accordance with this method.

Figure 1A:
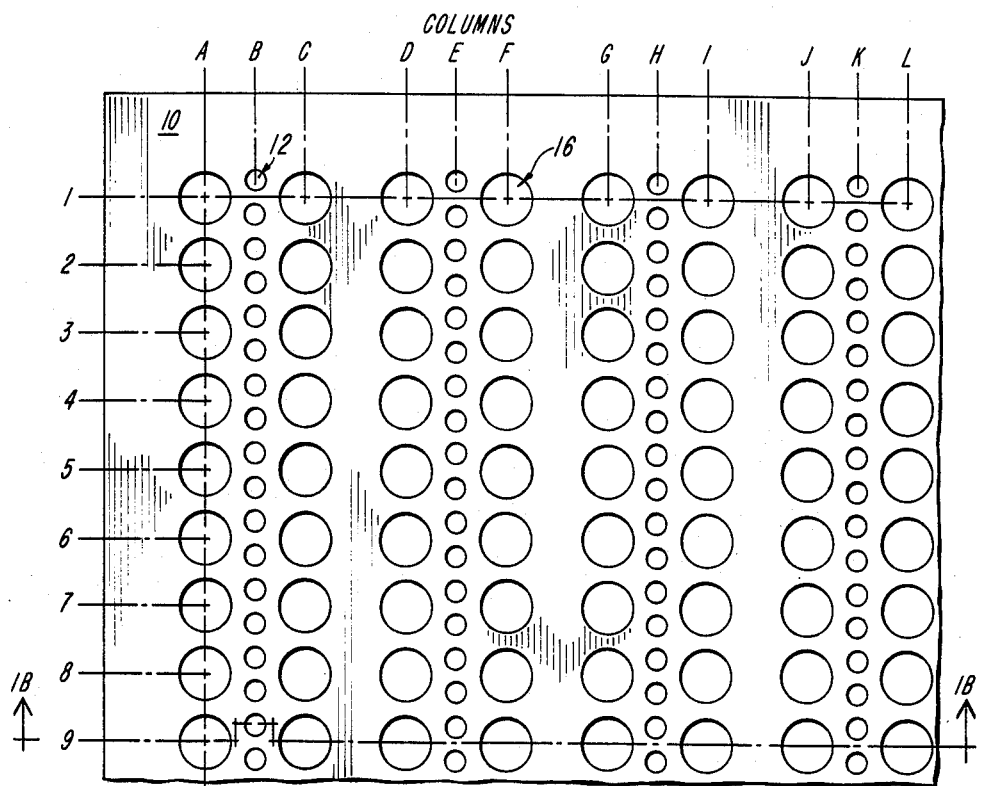
FIG. 1A is a partial top view of a wiring fixture plate in accordance with the present invention.
Figure 1B:
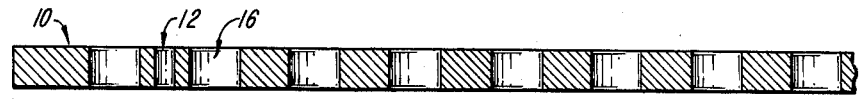
FIG. 1B is a sectional side view of the wiring fixture plate of FIG. 1A.

Referring to FIGS. 1A through 29B, the continuous insulated wire is routed on a fixture of the type illustrated in FIGS. 1A and 1B. Typically, a plurality of identical fixtures of the type shown are mounted on an X-Y axis table, and a routing head feeds a continuous wire through corresponding pins of each fixture with X-Y axis table movement numerically controlled. By ganging fixtures on a single X-Y axis table, several identical wire mats may be simultaneously produced thereby improving overall process efficiency and reducing the cost of circuit board production.

Figure 2A:
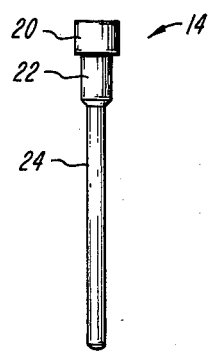
FIG. 2A is a side elevation view of a delete pin slideably receivable in selected apertures of the wiring fixture plate.
Figure 2B:
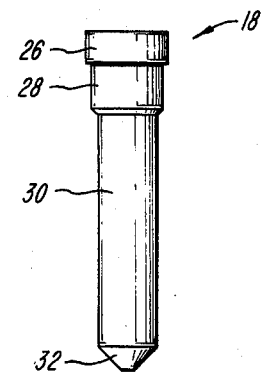
FIG. 2B is a side elevation view of a guide pin slideably receivable in selected apertures of the wiring fixture plate.

The wiring fixture plate 10 employed in practicing the present invention includes apertures 12 sized to slideably receive delete pins 14, illustrated in FIG. 2A, and apertures 16 sized to slideably receive guide pins 18 illustrated in FIG. 2B. Guide pin apertures 16 are disposed in rows and columns in a repetitive pattern of desired size. As shown in FIG. 1A, apertures for guide pins 18 are disposed in columns A, C, D, F, G . . . and have a fixed inter-column spacing. In a preferred embodiment of the invention the inter-column spacing is 0.150 inch. Guide pin apertures 16 of the wiring fixture plate 10 have a fixed inter-row spacing which in a preferred embodiment of the invention is 0.1 inch on centers, corresponding to the inter-pin spacing of typical dual in-line integrated circuit devices. Delete pin apertures 12 are disposed between adjacent columns of guide pin apertures, however, delete pin apertures 12 are located only between alternating adjacent guide pin columns. Thus, as seen in FIG. 1A, delete pin apertures 12 in column B are disposed between adjacent guide pin apertures 16 of columns A and C, and delete pin apertures 12 of column E are disposed between adjacent guide pin apertures 16 of columns D and F. Delete pin apertures 12 are disposed equi-distant above and below row center lines 1, 2, 3 . . . . In a preferred embodiment of the invention, the delete pin apertures 12 are disposed midway between rows, as previously indicated, and one delete pin aperture 12 is located 0.025 inch above each row center line, and another delete pin aperture 12 is disposed 0.025 inch below each row center line. Thus in the embodiment having inter-row spacings of 0.1 inch on centers, delete pin apertures have a fixed inter-pin spacing of 0.050 inch. In the illustrated embodiment, guide pin apertures 16 have a diameter of 0.076 inches and delete pin apertures 12 have a diameter of 0.036 inches. The wiring fixture plate is typically fabricated of a hard flat material such as metal, epoxy, or plastic or any other suitable material, and is presently illustrated as having a thickness of approximately 0.062 inch.

Delete pins 14 have a head portion 20 of a first diameter, a shoulder portion 22 of a second diameter less than the first diameter and a shank portion 24 of a diameter less than the shoulder 22. The overall length of the delete pin 14 is 0.323 inch with the head portion of length 0.030 inch, the shoulder portion of length 0.057 inch, and the shank 24 portion of length 0.236 inch in a preferred embodiment. In this preferred embodiment, the diameter of the head portion 20 of the delete pin 14 is 0.038 inch, the diameter of the shoulder portion 22 is 0.033 inch, and the diameter of the shank portion 24 is 0.018 inch. The delete pin 14 shoulder portion 22 is thus slideably receivable in wiring fixture plate 10 apertures 12.

The guide pin 18 shown in FIG. 2B, includes a head portion 26 of a first diameter, a shoulder portion 28 of a second diameter less than the first diameter and a shank portion 30 of a third diameter less than the shoulder 28 diameter. As illustrated, ends 32 of the guide pins 18 are provided with a chamfer for reasons which will subsequently be appreciated. In the illustrated embodiment, the head portion 26 of guide pins 18 has a 0.078 inch diameter, the shoulder portion 26 has a 0.073 inch diameter and the shank portion 30 has a 0.065 inch diameter. The overall length of the guide pins is 0.353 inch; the head portion 26 being 0.030 inch in length, the shoulder portion 28 being 0.055 inch in length and the shank being 0.268 inch in length. The shoulder portion 28 of the guide pin 18 is sized to be slideably received within guide pin apertures 16 of the wiring fixture plate 10.

Figure 3:
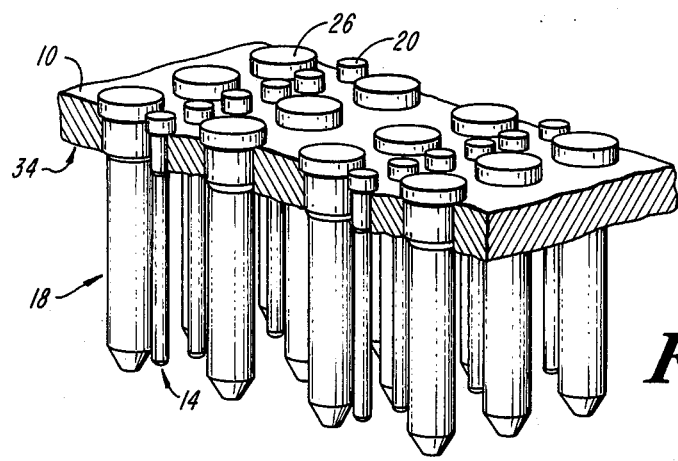
FIG. 3 is a cutaway perspective view illustrating guide and delete pins loaded in respective apertures of the wiring fixture plate.

As illustrated in FIG. 3, delete pins 14 and guide pins 18 are slideably disposed within respective delete pin apertures 12 and guide pin apertures 16 of the fixture plate 10 such that shanks of the respective pins project from a wiring surface 34 of the fixture plate 10. Head portions 20 and 26 of respective delete and guide pins 14 and 18 are of diameters larger than the respective pin receiving apertures of the fixture plate 10 and thereby maintain the pins in fixed normally vertical orientation following insertion in respective pin apertures. The fixture plate 10 may be populated with delete pins 14 and guide pins 18 by manually inserting pins into appropriate receiving apertures of the plate or alternatively via any suitable automated loading technique. In one such technique, a mask is placed over guide pin apertures 16, delete pins are disposed over the mask, and the fixture plate is vibrated causing delete pins to populate delete pin apertures. Delete pins are maintained in position by a vacuum source applied to the wiring surface 34 of the fixture plate 10. The mask is removed, and guide pins are disposed above the fixture plate 10, and the fixture plate is vibrated to populate guide pin apertures 16. Any appropriate technique for populating the fixture plate 10 with guide pins 18 and delete pins 14 may be employed to accomplish this pin loading step.

Figure 4:
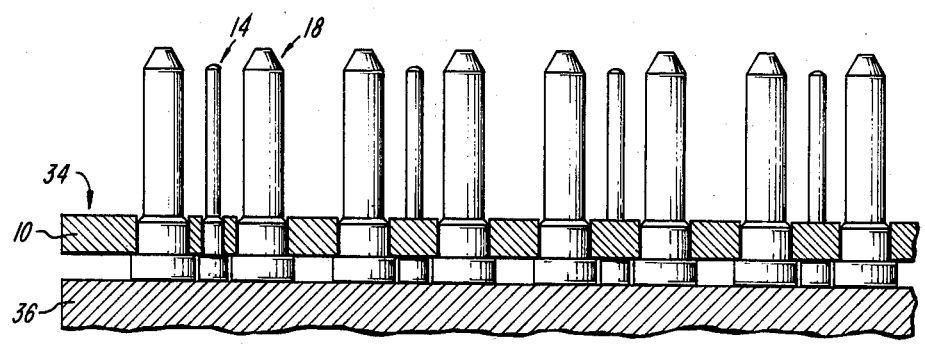
FIG. 4 is a sectional elevation view showing the fixture plate inverted and a bottom plate employed to retain the guide and delete pins within respective apertures.
Figure 5:
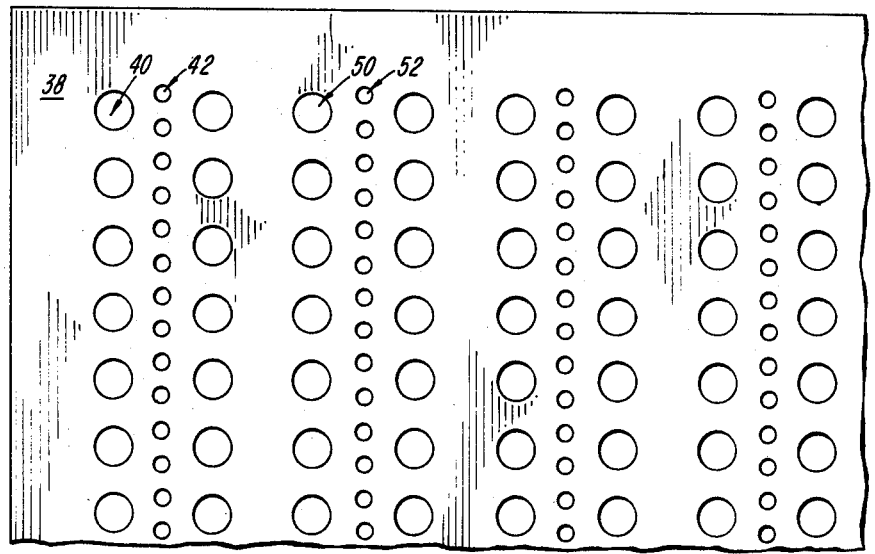
FIG. 5 is a partial top view illustrating a pin retaining plate in accordance with the present invention.

In a fixture plate inverting step, a bottom plate 36 is applied over the head portions of guide pins 18 and delete pins 14 to capture the head portions of the pins between the bottom plate 36 and the fixture plate 10, and the fixture plate 10 is inverted to assume the orientation illustrated in FIG. 4. The bottom plate may be any suitably sized material having a flat head confronting surface. Such materials as one quarter inch G-10 epoxy or metal may be suitably employed for fabrication of the bottom plate 36.

A pin retaining plate 38 having apertures with centers correspondingly located with the apertures of the wiring fixture plate 10 is disposed over shanks of delete pins 14 and guide pins 18 to maintain the pins in fixed vertical position within the wiring fixture plate 10. The pin retaining plate 38 has guide pin apertures 40 and delete pin apertures 42 sized for interference fit with the shanks 30 of guide pins 18 and shanks 24 of delete pins 14, respectively. The pin retaining plate 38 is registered over the fixture plate 10 such that guide pin apertures 40 and delete pin apertures 42 coaxially align with the shanks of the respective guide and delete pins. In the present embodiment, guide pin apertures 40 of the pin retaining plate 38 have a diameter of 0.062 inch and delete pin apertures 42 of the pin retaining plate 38 have a diameter of 0.016 inch. The pin retaining plate is fabricated of a resilient material, such as chipboard and is presently shown to be approximately 0.030 inch in thickness.

Figure 6:
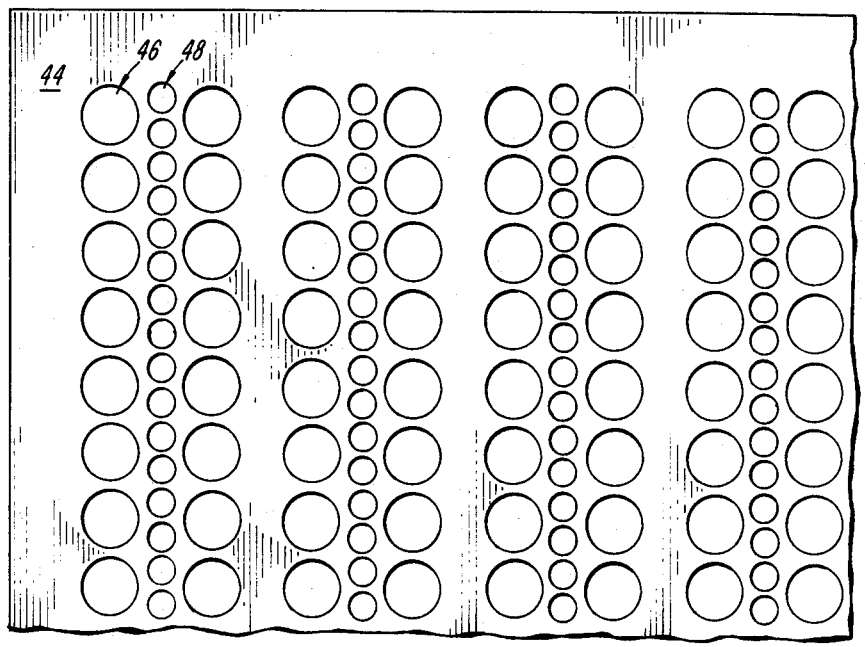
FIG. 6 is a partial top view illustrating a clearance plate in accordance with the present invention.

A clearance plate 44, such as that illustrated in FIG. 6, having apertures with centers correspondingly located with the centers of apertures of the wiring fixture plate 10 has guide pin apertures 46 and delete pin apertures 48 and sized for clearance fit over respectively guide pin 18 shanks 30 and delete pin 14 shanks 24. The clearance plate is fabricated of a hard material having flat surfaces such as metal or G-10 epoxy and in the present embodiment is shown to be approximately 0.250 inch in thickness. Guide pin apertures 46 in the illustrated embodiment are 0.085 inch in diameter and delete pin apertures 48 are 0.045 inch in diameter.

Figure 7:
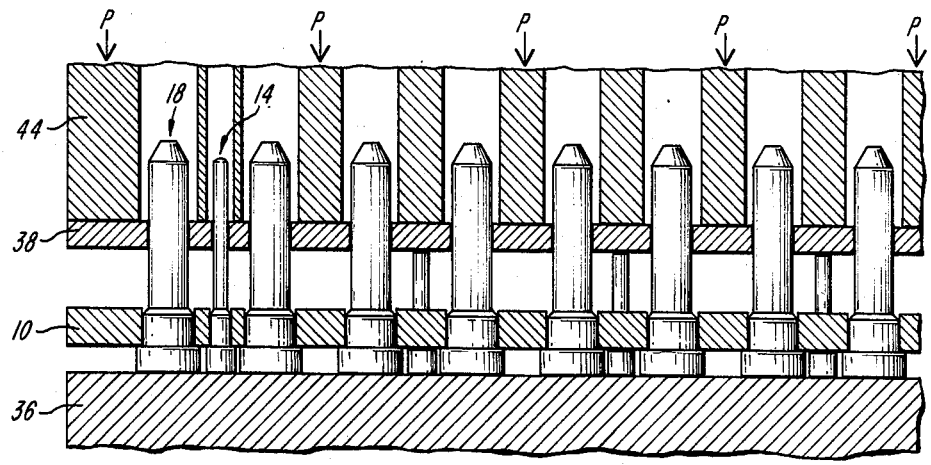
FIG. 7 is a sectional elevation view illustrating the pin retaining plate disposed over guide and delete pins to frictionally maintain the pins in a normally vertical orientation.

As illustrated in FIG. 7, the pin retaining plate 38 is coaxially aligned with guide pin and delete pin apertures over respective guide pin and delete pin shanks, and the clearance plate 44 is correspondingly positioned above the pin retaining plate 38. A compressive pressure is applied to the clearance plate 44 to urge the pin retaining plate 38 into confronting relation with the fixture plate 10. Since the guide pin apertures 40 and delete pin apertures 42 of the pin retaining plate 38 are of diameters smaller than the shanks of respective guide pins 18 and delete pins 14, the pin retaining plate 38 aperture walls frictionally engage the shanks of the respective pins and maintain the pins in a fixed vertical orientation within the fixture plate. Since the clearance plate 44 has guide pin apertures 46 and delete pin apertures 48 of diameters greater than respective guide pins 18 and delete pins 14, upon application of compressive pressure to the clearance plate 44, the plate 44 slides freely downward over the respective shanks under compressive pressure, and is readily removed once the pin retaining plate 38 is in confronting relation with the wiring fixture plate 10.

Figure 8:
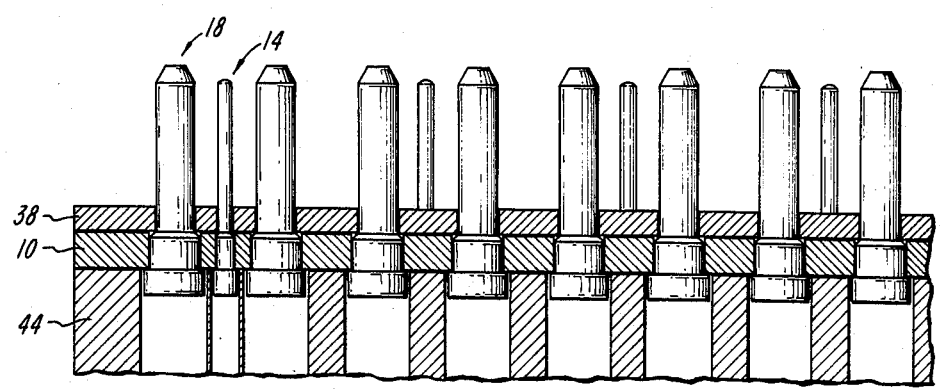
FIG. 8 is a sectional elevation view illustrating the clearance plate substituted for the bottom plate.
Figure 9:
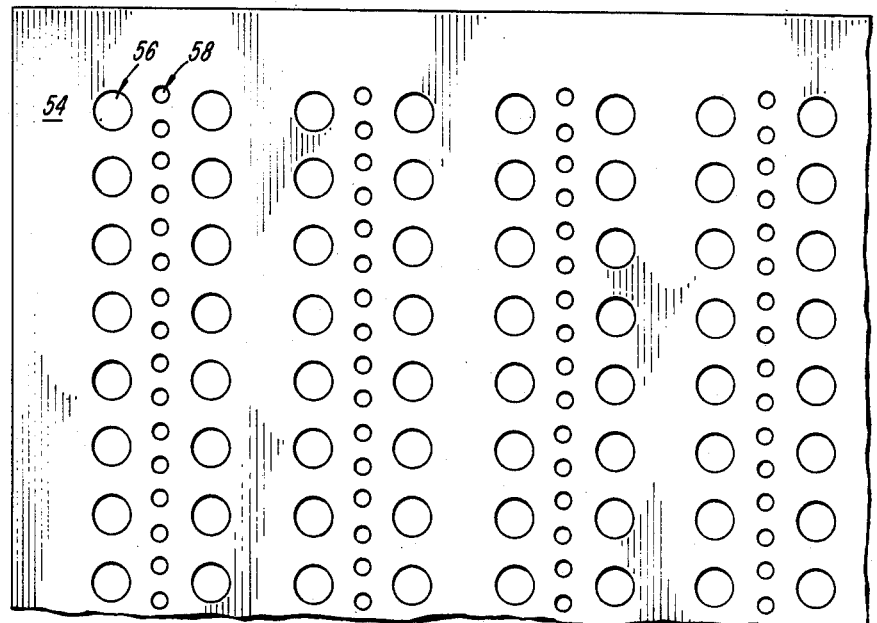
FIG. 9 is a partial top view of the cutter backing plate employed in practicing the present invention.
Figure 10:
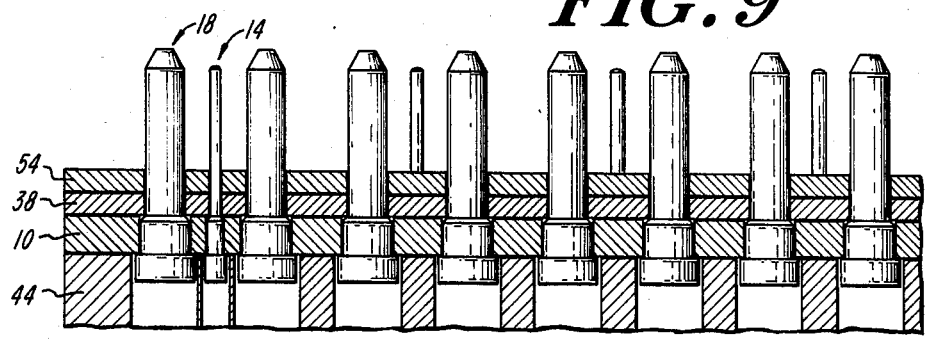
FIG. 10 is a sectional side view showing the cutter backing plate disposed over guide and delete pins and in confronting relation with the pin retaining plate.

In a next operation the bottom plate 36 is removed from confronting relation with the heads of delete pins 14 and heads of guide pins 18, and the clearance plate 44 is disposed below the fixture plate 10 such that guide pin apertures 46 and delete pin apertures 48 of the clearance plate 44 are in coaxial alignment with respective guide pin apertures 16 and delete pin apertures 12 of the wiring fixture plate 10. Since the heads 26 of guide pins 18 and the heads 20 of delete pins 14 are of diameters less than respective apertures of the clearance plate 44, the heads of guide pins 18 and delete pins 14 are slideably received within respective apertures of the clearance plate 44, as illustrated in FIG. 8. Frictional engagement of guide pin aperture walls 50 and delete pin aperture walls 52 of the pin retaining plate 38 with respective guide and delete pin shanks retains the pins in the fixture plate 10 after substitution of the clearance plate 44 for the bottom plate 36 subjacent the wiring fixture plate 10. A cutter backing plate 54 having guide pin apertures 56 and delete pin apertures 58 with centers correspondingly located with the centers of guide pin apertures 16 and delete pin apertures 12 of the wiring fixture plate 10 is slideably disposed over guide pins 18 and delete pins 14 and in confronting relation with the pin retaining plate 38, as illustrated in FIG. 10. Guide pin apertures 56 and delete pin apertures 58 of the cutter backing plate 54 are sized for clearance fit over guide pin shanks 30 and delete pin shanks 40 of the respective pins. In the present embodiment, the diameter of the guide pin apertures 56 is 0.072 inch and the diameter of delete pin apertures 58 is 0.020 inch.

Figure 11A:
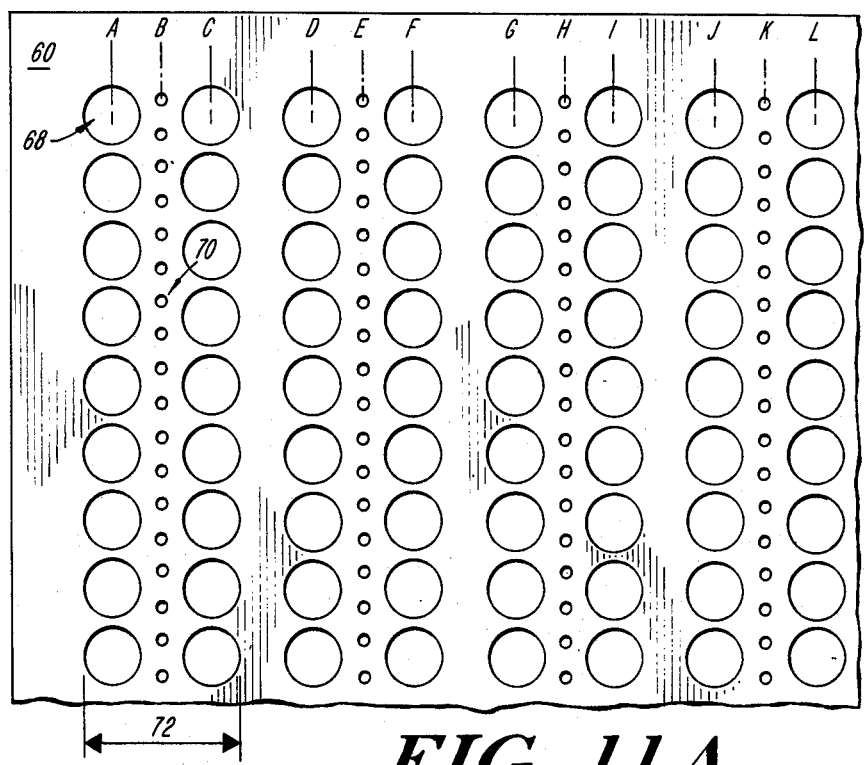
FIG. 11A is a top view of a first multilayered sheet comprising an adhesive layer and outer release layers.
Figure 11B:
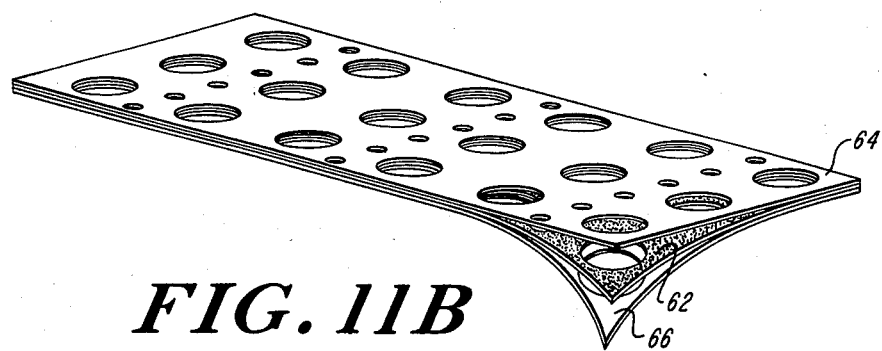
FIG. 11B is a perspective view of the multilayered sheet of FIG. 11A with release and adhesive layers partially peeled away.

In a next operation, a first multilayered sheet 60 comprising an adhesive layer 62, an upper release layer 64 and a lower release layer 66 are slideably disposed on the fixture in confronting relation with the cutter backing plate 54 after peelably removing the upper layer 64 from the adhesive layer 62. The adhesive layer 62 comprises a thermoplastic adhesive material such as nitrite phenolic or any other suitable thermoplastic adhesive material. Prior to application of the first multilayered sheet 60 to the fixture, the sheet is pre-drilled as illustrated in FIGS. 11A and 11B. The upper release layer 64 and the lower layer 66 of the multilayered sheet 60 are typically fabricated of a release paper impregnated with a wax like material to permit peelable removal of the respective layers from the adhesive layer 62. The upper release layer 64 is treated with a release agent which reduces adhesion of the layer 64 to the adhesive 62. Since the lower release layer 66 is not treated with a release agent, upon peeling, the upper release layer 64 readily separates from the adhesive layer 62 leaving the adhesive layer 62 and the lower release layer 66 in adhesive contact. Typically, a plurality of first multilayered sheets 60 are pre-drilled in stacked relationship to improve overall process efficiency.

Figure 12:
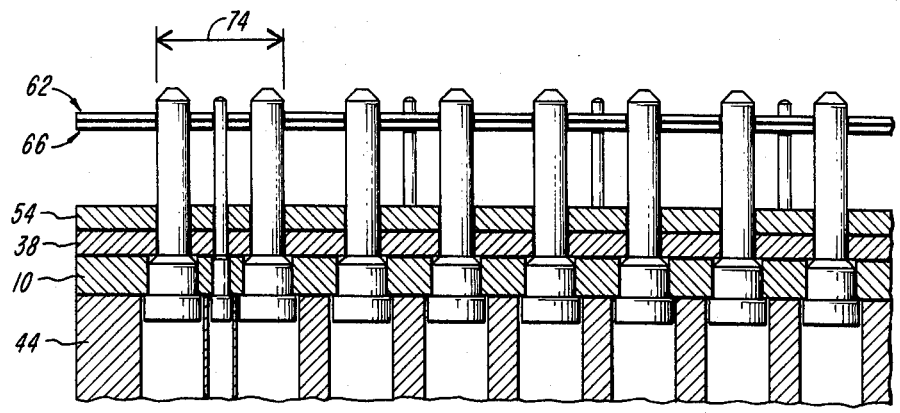
FIG. 12 is a sectional side view illustrating the addition of release and adhesive layers to the fixture plate.
Figure 13:
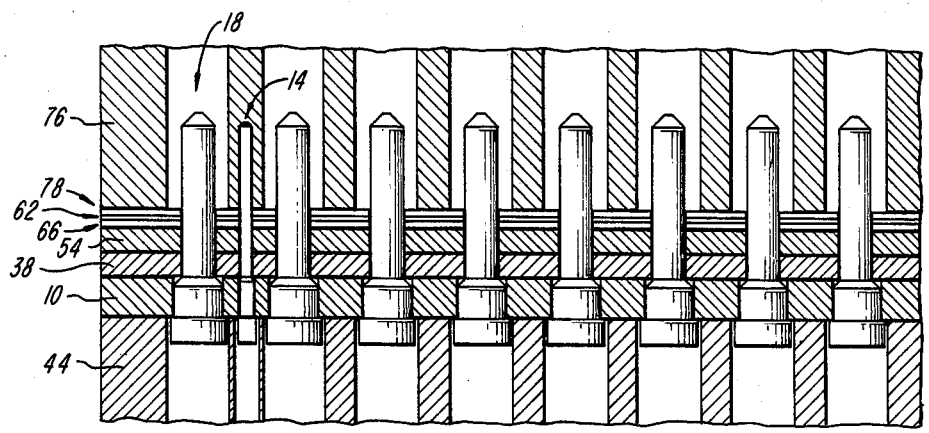
FIG. 13 is a sectional side view illustrating flattening of the adhesive and release layers into confronting relation with the cutter backing plate.

The first multilayered sheet 60 includes guide pin apertures 68 and delete pin apertures 70, with delete pin apertures 70 disposed between alternating adjacent columns of guide pins apertures 68. The inter-column spacing between guide pin apertures 68 and intermediate delete pin apertures 70, such as the spacing between columns A and C or D and F is 0.120 inch in the illustrated embodiment. The on center inter-column spacing of other adjacent guide pin apertures 62, such as between columns C and D or F and G is 0.180 inch as presently shown. Delete pin apertures 70 are illustrated as being 0.021 inch in diameter and are located on centers corresponding to center locations of delete pin apertures 12 of the wiring fixture plate 10. Guide pin apertures 68 of the first multilayered sheet 60 are 0.090 inch in diameter. Thus, the lateral distance 72 between outer extremities of guide pin aperture 68 pairs in columns A and C, D and F, etc. is 0.210 inch. The lateral distance 74 between the outer extremities of corresponding guide pins 18 is 0.215 inch. As illustrated in FIG. 12, after peelable removal of the upper release layer 64 from the adhesive layer 62 of the first multilayered sheet 60, the lower release layer 66 and the adhesive layer 62 are slideably disposed over the shanks of guide pins 18 and delete pins 14 such that the lower release layer 66 is in confronting relation with the cutter backing plate 54. Since the distance 72 is less than the distance 74, an interference occurs between the multilayered sheet 60 and guide pins 18 as the lower release layer 66 and the adhesive layer 62 are slideably disposed over the guide pin shank 30 and delete pin shank 24. The pliable nature of the release layer 66 and adhesive layer 62 permit these layers to be urged into confronting relation with the cutter backing plate 54 as illustrated in FIG. 13. To assure that the release layer 66 and adhesive layer 62 are in planar confronting relation with the cutter backing plate 54, a clearance plate 76 having a release layer 78 bonded to the adhesive confronting surface of the plate 76 is slideably disposed over the shanks of delete pins 14 and guide pins 18 and a light compressive pressure is applied. The presence of the release layer 78 permits removal of the clearance plate 76 from the fixture after this pressure application step without adhesion of the adhesive layer 62 to the plate 76. After removal of the clearance plate 76 and the release layer 78 bonded thereto, the fixture is appropriately configured for routing of the continuous wire in accordance with the present invention.

Figure 14:
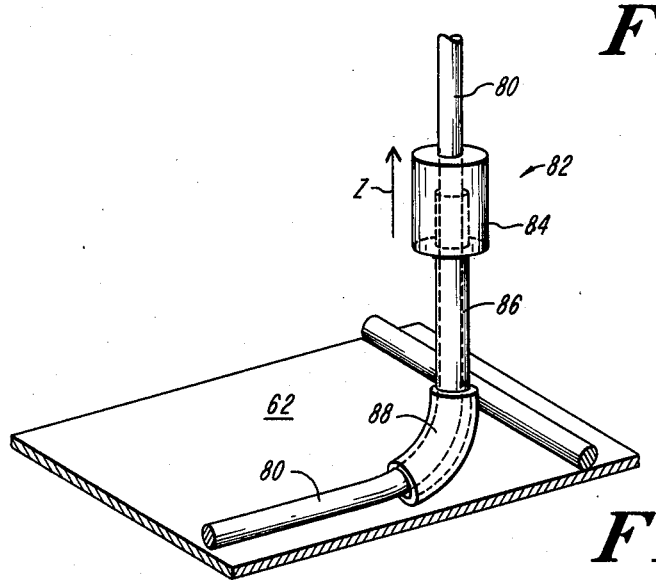
FIG. 14 is a perspective view of a wiring head employed in accordance with the present invention.

A continuous wire 80 is routed along a predetermined path under tension and in confronting relation with selected guide pins 18 and delete pins 14 employing a routing head 82 of the type illustrated in FIG. 14. A routing head 82 of the type shown is provided for each fixture to have a continuous wire 80 routed. The routing head 82 is capable of Z axis movement only, and routing of the continuous insulated wire 80 occurs as an X-Y axis table supporting one or more fixtures moves subjacent the routing head 82 under numerical control. Any equivalent means to achieve the above-described relative head and fixture movement may be substituted for the illustrated technique.

The routing head 82 includes a bushing 84 having a bore sized to receive a tubular steel member 86. The illustrated head includes a tubular member 86 with an outer diameter of approximately 0.020 inch and an inner diameter of approximately 0.010 inch, permitting free passage of the continuous wire 80 through the member 86. A flexible tubular member 88 is concentrically affixed to the tubular member 86 as illustrated in FIG. 14. The flexible tubular member 88 permits routing of the continuous wire 80 just above the adhesive layer 62 and allows flexure in the event the member 88 traverses a previously routed segment of the continuous wire 80.

Figure 15A:
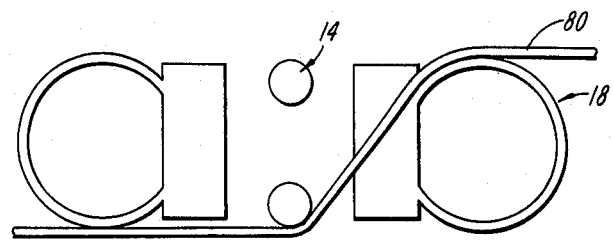
FIGS. 15A-15D are schematic views illustrating wiring conventions in accordance with the present invention.
Figure 15B:
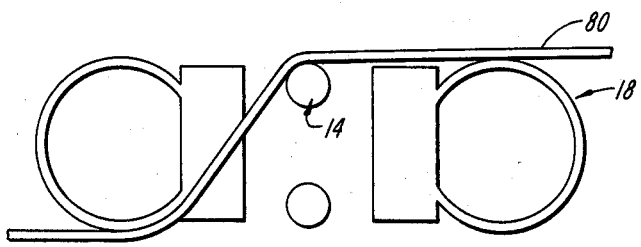
Figure 15C:
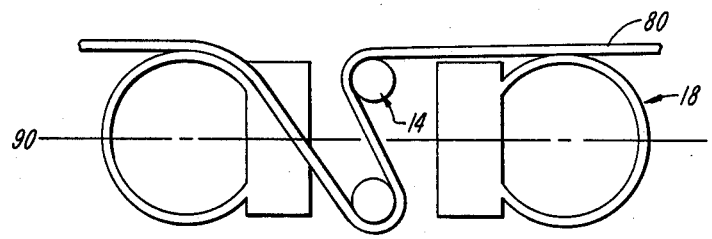
Figure 15D:
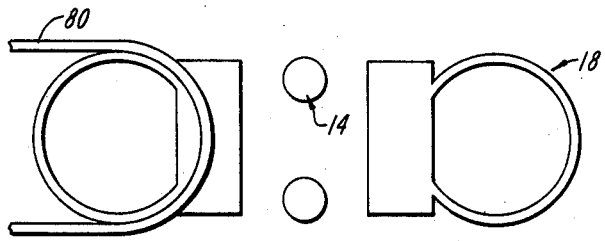
Figure 16A:
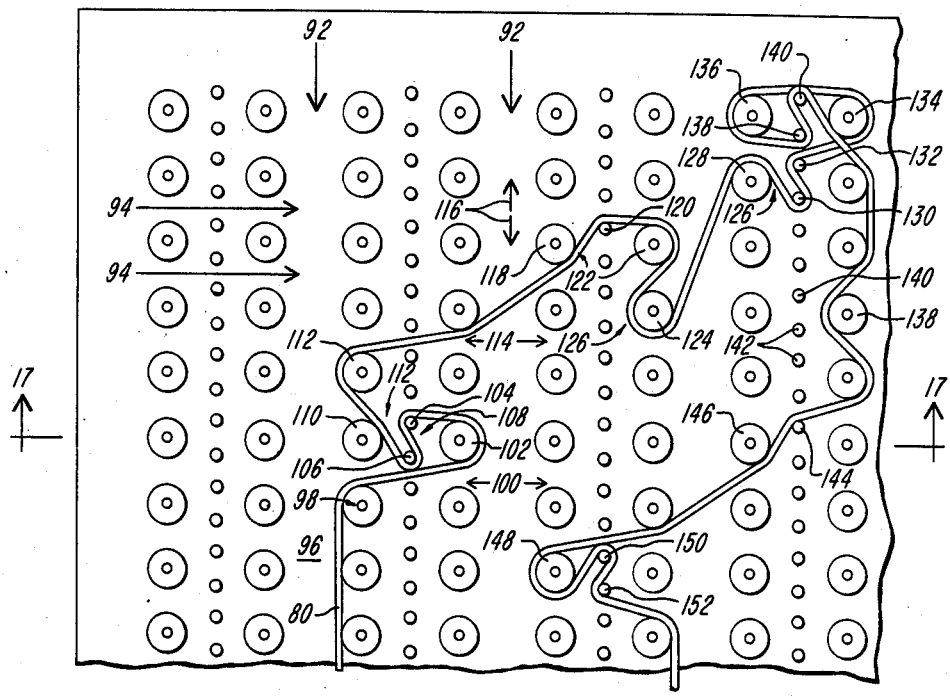
FIG. 16A is a top schematic view illustrating routing of the continuous wire on the wiring fixture plate along a predetermined path through selected guide and delete pins.
Figure 16B:
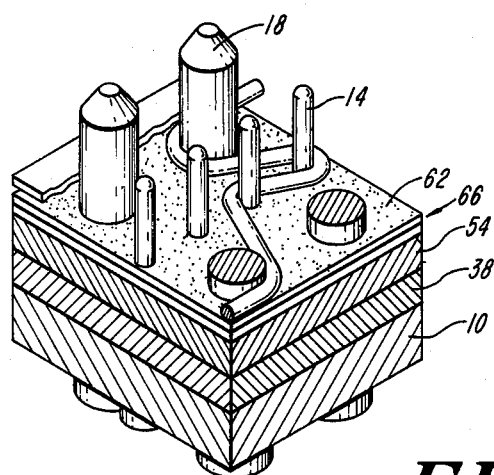
FIG. 16B is a cutaway perspective view illustrating routing of the continuous wire in accordance with the present invention.

Routing of the continuous wire 80 is performed in accordance with defined routing conventions illustrated schematically in FIGS. 15A through 15D, and in wiring examples shown in FIGS. 16A and 16B. The routing conventions assure that the wire 80, after routing and mating with a circuit board in accordance with this method, will confront selected conductive pads provided on the circuit board. Shanks of guide pins 18 and delete pins 14 serve designated functions in the routing process and in combination define intended locations of interconnection, intended locations of wire severance, and permissible wire routing channels.

Intended interconnection locations are defined by wire routing paths in which the continuous wire 80 passes diagonally between a guide pin 18 and a delete pin 14 as illustrated in FIGS. 15A and 15B. Alternatively, an intended interconnection location is defined by wire 80 travel around an arc of the guide pin 18 adjacent delete pins 14, as shown in FIG. 15D. Wire 80 routing between a pair of delete pins 14 disposed above and below a row centerline 90 in the manner illustrated in FIG. 15C defines an intended location of wire 80 severance between the respective delete pins 14. The wire 80 may be routed freely without interconnection or severance between vertical channels 92 or horizontal rows 94, illustrated in FIG. 16A. The continuous wire may be routed only once through each intended interconnection location.

These routing conventions will be further understood by reference to the purely illustrative example provided below.

ROUTING EXAMPLE

Referring to FIG. 16A, routing of the continuous wire 80 is initiated after anchoring the wire 80 at the edge of the fixture. A continuous wire 80 is routed through vertical channel 96 in confronting relation with guide pin 98 and then through horizontal row 100 to guide pin 102. The wire 80 passes diagonally between delete pins 104 and 106 defining a first location of wire severance 108 between delete pins 104 and 106. The wire 80 is then routed diagonally between delete pin 106 and guide pin 110 defining an intended first point of interconnection 112 adjacent guide pin 110. The wire 80 is then routed in confronting relation with guide pin 112 through horizontal row 114, vertical channel 116 and in confronting relation with guide pin 118. The wire 80 is then routed diagonally between guide pin 118 and delete pin 120 defining a second point of interconnection 122 adjacent guide pin 118 in this first wire net. The wire 80 is then routed around guide pin 122 and guide pin 124 defining a third intended location of interconnection 126 adjacent guide pin 124. A fourth intended location of interconnection 126 is defined by routing of the wire 80 in confronting relation with guide pin 128 and diagonally between guide pin 128 and delete pin 130. The wire is routed diagonally between delete pins 130 and 132 thereby defining an intended location of wire severance completing points of intended interconnection in this first wire net. The wire 80 is then routed around guide pin 134, guide pin 136 and diagonally between delete pin 138 and 140 defining an intended location of wire severance. The wire is next routed adjacent pin 134 defining a first point of intended wire interconnection in a second wire net adjacent to guide pin 134. A second point of intended wire interconnection is obtained by routing the wire 80 around guide pin 138 along the portion of the guide pin circumference adjacent delete pins 140 and 142. A third point of wire interconnection is achieved by routing the wire 80 diagonally between delete pin 144 and guide pin 146, and a final point of wire 80 interconnection in this second wire net is achieved by routing the wire 80 in confronting relation with guide pin 148 and diagonally to delete pin 150. The wire is routed between delete pins 150 and 152 defining an intended location of wire severance between these delete pins and finally the wire 80 is routed to the perimeter of the fixture where it is anchored.

Figure 17:
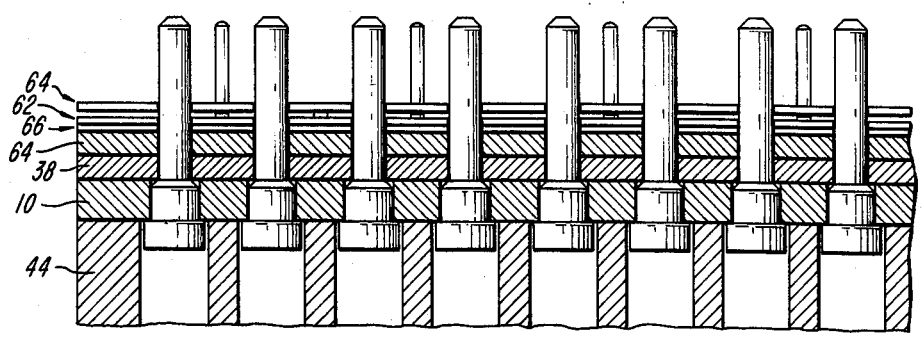
FIG. 17 is a sectional side view illustrating the addition of a release layer over the continuous routed wire.
Figure 18:
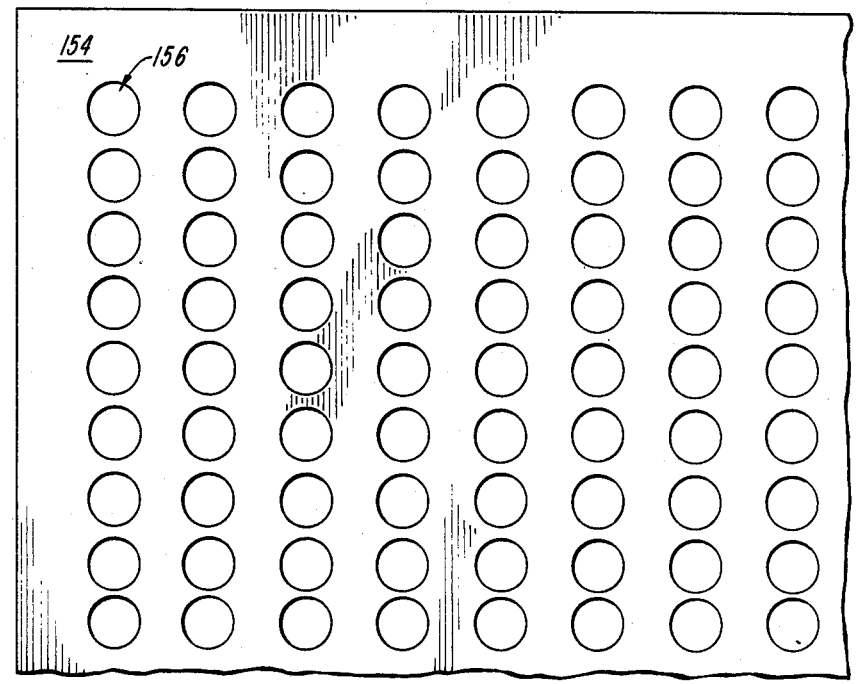
FIG. 18 is a partial top view of a pressure plate employed in practicing the present invention.
Figure 19:
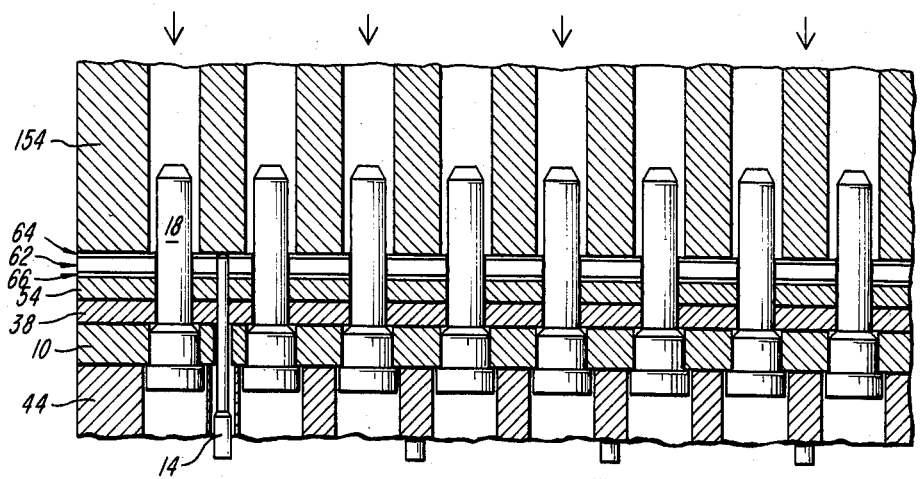
FIG. 19 is a sectional side view illustrating the application of compressive pressure to the continuous wire and underlying adhesive layer to adhere the wire to the layer.

After routing of the continuous wire 80 along a predetermined path in accordance with defined wiring conventions, the upper release layer 64 which was previously peelably removed from the adhesive layer 62 of the first multilayered sheet is slideably disposed over shanks of respective guide pins and delete pins and in confronting relation with the continuous routed wire 80, as illustrated in FIG. 17. A pressure plate 154 illustrated in FIG. 18 and having guide pin apertures 156 on centers corresponding to centers of guide pin apertures 16 of the wiring fixture plate 10 is disposed above the guide pins such that guide pin apertures 156 coaxially align with shanks of guide pins 18. It is noted that the pressure plate 154 includes no corresponding apertures for the delete pins 14. After coaxial alignment of the pressure plate 154 over the fixture plate 10, a compressive pressure is applied to the fixture plate 10 and pressure plate 154 thereby adhering the continuous wire 80 to the underlying adhesive layer 62 while slideably urging delete pins 14 downward into delete pin apertures 48 of the clearance plate 44 disposed below the fixture plate 10. The pressure plate 44 is thereupon removed preparatory to the severing operation.

Figure 20:
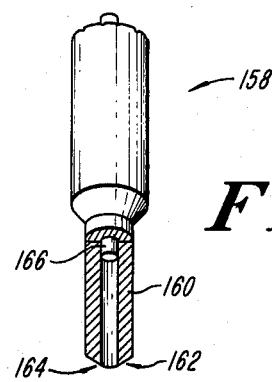
FIG. 20 is a cutaway perspective view of a cutting head in accordance with the present invention.
Figure 21:
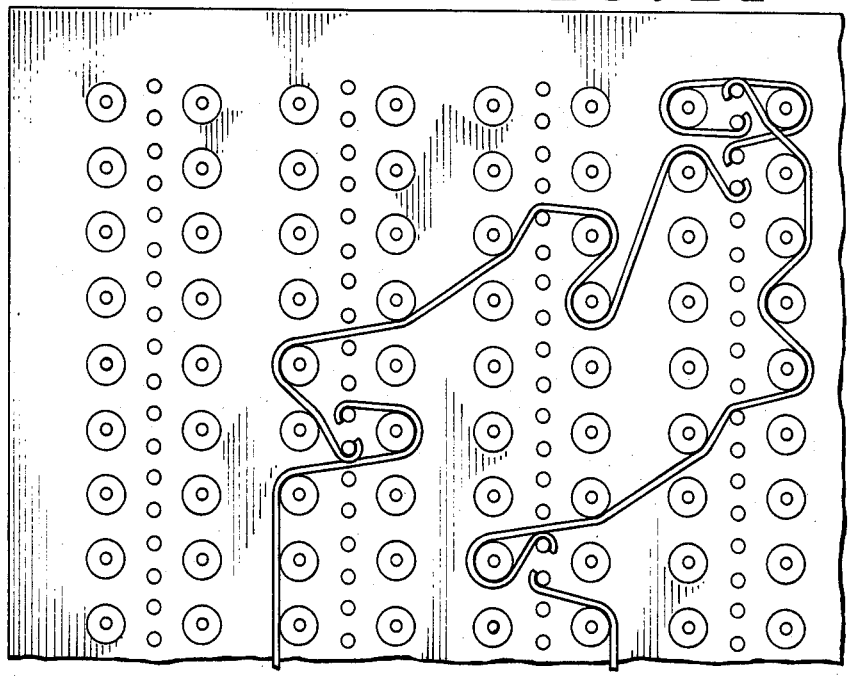
FIG. 21 is a top schematic view illustrating wire nets following severance of the continuous wire with the cutting head of FIG. 20.

The continuous wire 80 is next severed to form a plurality of wire nets using a cutting head 158 of the type illustrated in FIG. 20. The cutting head 158 has a tubular barrel 160 tapered at an end 162 and defining a circular cutting edge 164. The cutting edge 164 in the presently illustrated embodiment is of 0.035 inch diameter. A pheumatically operated stripper pin 166 is located within the bore of tubular barrel 60.

The cutting head 158 is vertically disposed with respect to the wiring fixture plate 10 and is adapted for Z axis movement. Plural cutting heads 158 may be disposed above a number of wiring fixture plates 10 thereby permitting simultaneous severance of the wires 80 in each of a plurality of fixtures. The wiring fixture plate 10 is disposed on an X-Y axis table which moves under automated numerical control to position the fixture plate 10 such that an intended location of wire 80 severance is precisely aligned subjacent the cutting edge 164 of the cutting head 158. The cutting head 158 is actuated for downward movement and the cutting edge 164 of the barrel 160 impacts the layers disposed on the fixture, stamping out a circular section of release paper 64, wire 80, adhesive 62, release paper 66, and a plug from the cutter backing plate 54. After severance of the wire 80, the cutting head 158 retracts vertically to a position above the severed wire 80 location. The stripper pin 166 is thereupon actuated for axial movement in the bore of the barrel 160 to eject waste material disposed in the bore as a consequence of the severing operation. Typically, a source of vacuum is disposed adjacent the cutting head 158 for removal of the waste material after ejection from the bore of the barrel 160 by stripper pin 166. The wire 80 is severed in the above manner at all intended location of wire severance thereby forming a wire mat comprising a plurality of wire nets. The continuous wire 80 illustrated in the wiring example of FIG. 16A is shown following the severing operation in FIG. 21.

Figure 22:
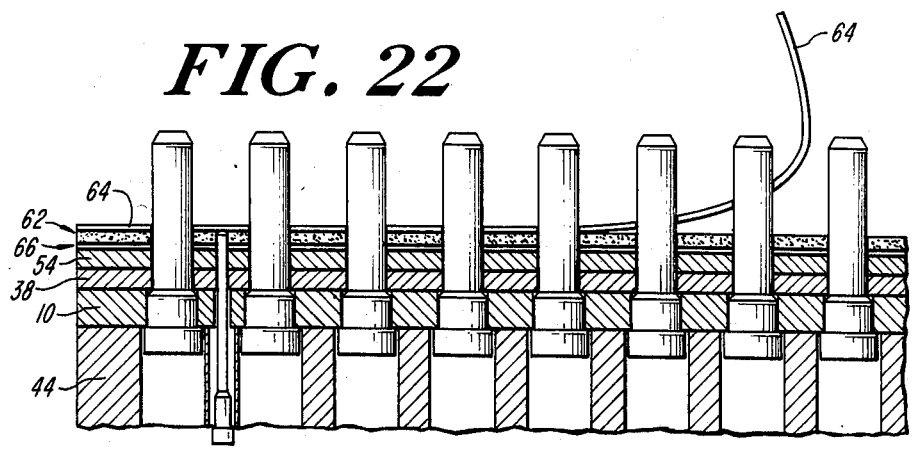
FIG. 22 is a sectional side view illustrating depression of delete pins resulting from application of the pressure plate and peelable removal of the upper release layer.
Figure 23:
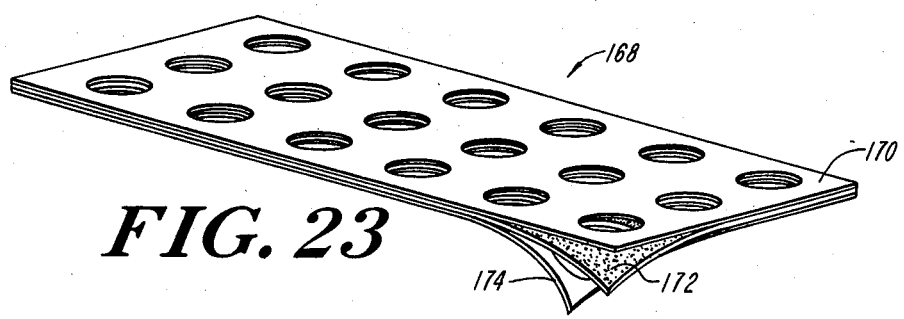
FIG. 23 is a perspective view of a second multilayered sheet employed in accordance with the present invention.
Figure 24:
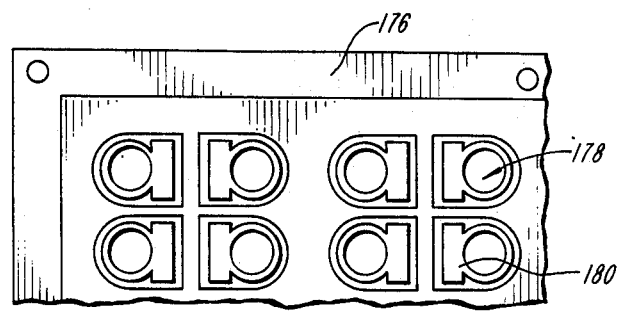
FIG. 24 is a partial top view of a circuit board used in accordance with the present invention.
Figure 25:
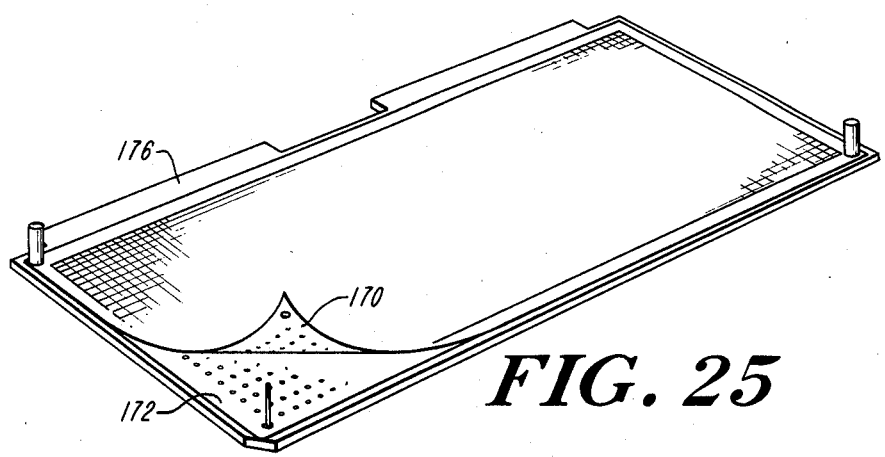
FIG. 25 is a perspective view illustrating the adhesion of the adhesive layer of the second multilayered sheet to the circuit board of FIG. 24.

Following the severing operation, the release layer 64 is peelably removed from the adhesive layer 62 as shown in FIG. 22.

In accordance with the present method, a second multilayer sheet 168 comprising an upper release layer 170, an adhesive layer 172 and a lower release layer 174 is precisely registered above a circuit board in accordance with the present invention, and the adhesive layer 172 is adhered to the circuit board 176 following peelable removal of the lower release layer 174 of the sheet 168. The second multilayer sheet includes guide pin apertures having center locations and diameters identical to those of the first multilayered sheet 60. It is noted that the second multilayer sheet include no delete pin apertures.

The circuit board 176 employed in practicing the present invention has a plurality of pin socket receiving apertures 178. Each aperture is plated through during the board fabrication process, and conductive material on the aperture wall electrically communicate with a conductive pad 180 adjacent each aperture. Conductive pads are 0.025 inch in width and 0.050 inch in length.

The second multilayer sheet 168, after removal of the lower release layer 174, is applied to the circuit board 176 such that the adhesive layer 172 confronts the circuit board 176 surface. Precise alignment of the sheet 168 with the circuit board 176 causes conductive pads 180 to be exposed through apertures of the multilayer sheet 160.

The apertures 178 of the circuit board 176 are 0.040 inch in diameter and are disposed in rows and columns corresponding in center locations to the center locations of guide pin apertures 16 of the wiring fixture plate 10.

Figure 26:
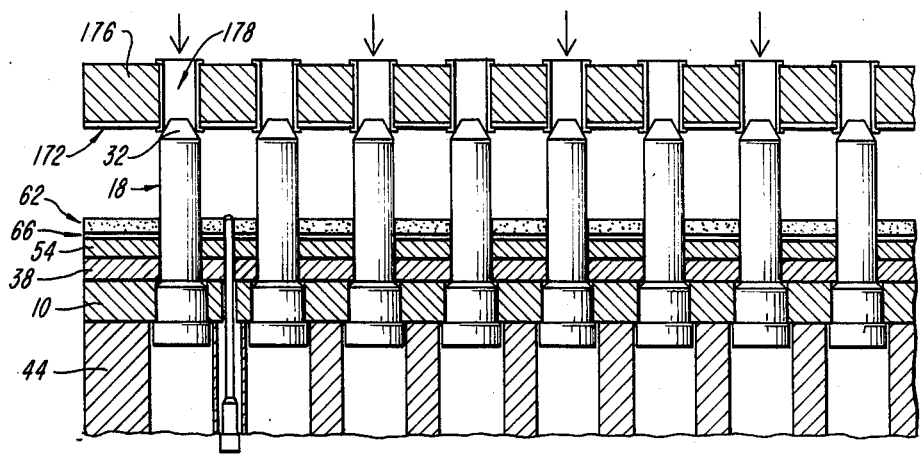
FIG. 26 is a sectional side view illustrating the registration of the printed circuit board of FIG. 24 over the guide pins and wiring fixture plate.

The adhesive layer 172 is adhered to the printed circuit board 176 under slight compressive pressure, and following adherence of the adhesive layer 172 the upper release layer 170 of the multilayer sheet 168 is peelably removed from the adhesive layer 172. The printed circuit board 176 and adhered adhesive layer 172 are coaxially aligned above respective guide pins 18, as illustrated in FIG. 26. The printed circuit board 176 is disposed such that the adhesive layer 172 confronts the plurality of wire nets and the underlying adhesive layer 62.

The socket pin receiving apertures 178 of the circuit board 176 are of diameter smaller than the diameter of the shank 30 of the guide pin 18, as previously indicated. The diameter of the socket pin receiving apertures 178 is 0.040 inch, and the diameter of the shank 30 of delete pin 18 is 0.065 inch. The chamfered end 32 of guide pin 18 precisely align with apertures 178 upon application of compressive pressure to the fixture 10 and circuit board 178.

Figure 27:
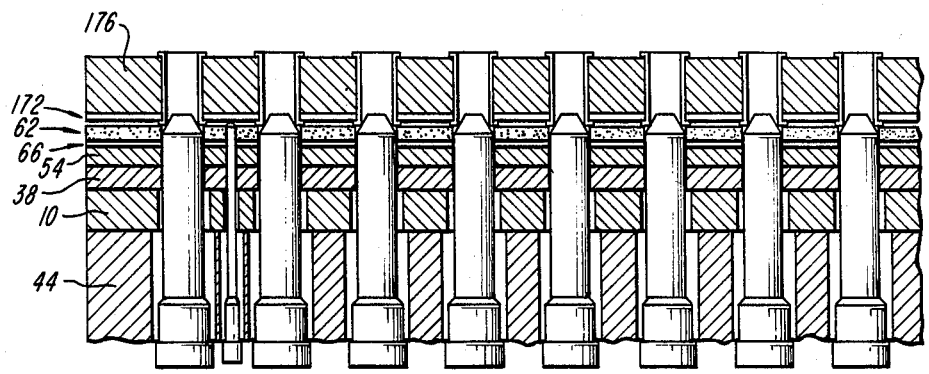
FIG. 27 is a sectional side view illustrating mating of the printed circuit board with the underlying wire mat after application of compressive pressure to the circuit board and mat.

In a mating operation, the plurality of wire nets are adhered to the circuit board 176. Continued application of compressive pressure to the circuit board 176 and the fixture 10 urges the guide pins 18 downward through the fixture plate 10 and into the clearance plate 44, as illustrated in FIG. 27. Adhesive layers 172 and 78 achieve adhesive contact under compressive pressure thereby precisely locating wire nets of the wire 80 on the circuit board 176. By reason of the registration of the wire nets with the circuit board 176 achieved in accordance with this invention, selected points of wire nets confront selected conductive pads 180 after mating of the wire mat with the circuit board 176, as illustrated in FIG. 27. The circuit board 176 with adhesive layers 172 and 62, wire nets embedded therein and release layer 66 are then removed from the fixture. After removal of the circuit board 176 and adhered wire mat from the fixture, the release layer 66 is peelably removed from the adhesive layer 62. A low durometer rubber pad 182 is applied in confronting relation to the adhesive layer 62, and compressive pressure is applied to the circuit board 176 and rubber pad 182 to conformally coat the wire net 80 and circuit board 176 with adhesive material.

Following this conformal coating step, the circuit board 176 is placed in an oven and heated at elevated temperature to cure the thermoplastic adhesive layer. Typically, the adhesive is cured for three (3) hours at a temperature of 260° F.

The circuit board 176 is next coated with a solder flux by spraying, brushing, or any other suitable technique and the coated board is subjected to elevated temperature briefly to increase the viscosity of the flux. The board 176 is then loaded onto an X-Y axis table, having positioned thereover a soldering head 182 of the type illustrated in FIGS. 29A and 29B. The table is controlled to dispose a conductive pad 180 having a wire confronting the pad, directly beneath the soldering head 182. The soldering head 182, upon actuation, moves downward from the position illustrated in FIG. 29A to the position illustrated in FIG. 29B, urging the insulated wire into contact with the pad 180 and causing the wire insulation to vaporize in the vicinity of a pad 180. The pad 180 and confronting wire are heated, and solder on the respective pad reflows around the wire to complete the interconnection of the wire with the selected pad. The X-Y axis table and soldering head 182 are automatically cycled until all wires confronting conductive pads 180 have been soldered to the respective pads. Upon completion of the soldering operation, the circuit board 176 is fully interconnected in accordance with a pre-defined circuit wiring pattern.

The wired circuit board produced in accordance with the present invention is ultrasonically cleaned preparatory to insertion of pin receiving sockets, integrated circuits and other electrical components. The circuit board 176 in accordance with the present invention is adapted to accommodate all commonly available dual in-line components. Integrated circuits having 0.4 inch or 0.5 inch inter-row spacing are accommodated by slight deformation of integrated circuit leads to fit between selected columns of integrated circuit pin sockets disposed within pin socket receiving apertures located on 0.45 inch spacing.

The above described invention is illustrative of a novel method and circuit board which permits improved production efficiencies and overcomes significant disadvantages of prior wiring method. Other modifications, embodiments and departures from the present disclosure are possible without departing from the inventive concept contained herein. Consequently, the invention is to be viewed as embracing each and every novel feature and novel combination of features present in or possessed by the technique and articles herein disclosed and are limited solely by the scope and spirit of the appended claims.

What is claimed is:

1. A wire mat mateable and precisely alignable with a circuit board having a plurality of conductive pads disposed in a predetermined layout and for use in the manufacture of a wired circuit board having a predetermined interconnection pattern of said conductive pads comprising:

a layer of adhesive material having a first side and a second side and having a predetermined coefficient of adhesion;

a flexible supporting layer adhered to said first side of said layer of adhesive material;

said coefficient of adhesion being selected to permit peelable removal of said supporting layer from said layer of adhesive material;

a continuous insulated wire routed along a predetermined path selected to correspond to said predetermined pattern for interconnection of said conductive pads and disposed in adhered contact with said layer of adhesive material along substantially the entire length thereof, said wire being severable to permit selected interconnection of ones of said pads upon mating of said mat with said circuit board to achieve a desired interconnection pattern of said conductive pads;

said continuous insulated wire crossing over itself at a plurality of points along said predetermined path so as to form an overlaying portion and an underlying portion at each of said points wherein said overlaying portion is insulated from said underlying portion;

means for precisely aligning said wire mat with said circuit board such that selected points of said continuous wire confront selected ones of said conductive paths upon mating of said mat with said circuit board.

2. The wire mat of claim 1 wherein said adhesive layer is a sheet of thermoplastic adhesive.

3. The wire mat of claim 2 wherein said adhesive layer is a nitrite phenolic adhesive.

* * * * *